United States Patent
Komine et al.

(10) Patent No.: US 6,461,784 B1
(45) Date of Patent: Oct. 8, 2002

(54) PHOTOSENSITIVE PRINTING PLATE HAVING MAT PARTICLES FORMED ON THE PHOTOSENSITIVE LAYER AND METHOD OF PRODUCING THE SAME

(75) Inventors: Hirotaka Komine, Tatebayashi; Eiji Hayakawa, Utsunomiya, both of (JP)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 09/708,888

(22) Filed: Nov. 8, 2000

(30) Foreign Application Priority Data

Aug. 11, 1999 (JP) .............................. 11-317405

(51) Int. Cl.$^7$ .................... G03F 7/021; G03F 7/023; G03F 7/028
(52) U.S. Cl. ................. 430/162; 430/166; 430/273.1; 430/280.1; 430/288.1; 430/302
(58) Field of Search .................. 430/166, 162, 430/273.1, 302, 288.1, 280.1

(56) References Cited

U.S. PATENT DOCUMENTS

| | | | |
|---|---|---|---|
| 4,216,289 | * 8/1980 | Oda et al. | 430/302 |
| 4,288,526 | * 9/1981 | Oda et al. | 430/272.1 |
| 4,557,997 | 12/1985 | Nagano et al. | 430/162 |
| 4,626,484 | 12/1986 | Nishioka et al. | 430/273 |
| 5,028,512 | 7/1991 | Nagatani et al. | 430/300 |
| 5,576,137 | 11/1996 | Frass et al. | 430/166 |
| 5,595,862 | * 1/1997 | Fant et al. | 430/496 |
| 5,747,220 | * 5/1998 | Hidaka et al. | 430/273.1 |
| 5,916,741 | 6/1999 | Smith et al. | 430/537 |

FOREIGN PATENT DOCUMENTS

| | | |
|---|---|---|
| EP | 0154981 | 9/1985 |
| JP | 51111102 | 10/1976 |
| JP | 5512974 | 1/1980 |
| JP | 5734558 | 2/1982 |
| JP | 5758152 | 4/1982 |
| JP | 58182636 | 10/1983 |

* cited by examiner

Primary Examiner—John S. Chu
(74) Attorney, Agent, or Firm—Baker Botts L.L.P.

(57) ABSTRACT

The photosensitive printing plate of the present invention comprises a substrate, a photosensitive layer formed on the substrate, and mat particles formed on the photosensitive layer, wherein the mat particles contain a copolymer which contains at least one (meth)acrylamides as a unit. The method of producing the photosensitive printing plate of the present invention is a method which comprises the steps of forming a photosensitive layer on a substrate, and coating the photosensitive layer with a solution prepared by dissolving a copolymer containing at least one (meth)acrylamides as a unit in a solvent to form mat particles. The photosensitive printing plate of the present invention has excellent vacuum contact properties and resistance to friction and pressure and is free from tack on the surface when used, avoids problems in developing properties during long storage times, and is superior in terms of solubility in an exhausted developer.

19 Claims, 1 Drawing Sheet

US 6,461,784 B1

PHOTOSENSITIVE PRINTING PLATE HAVING MAT PARTICLES FORMED ON THE PHOTOSENSITIVE LAYER AND METHOD OF PRODUCING THE SAME

CROSS-REFERENCE TO RELATED APPLICATIONS

This application claims priority from Japanese application No. 11-317405, filed Aug. 11, 1999.

BACKGROUND OF THE INVENTION

1. Field of the Invention

The present invention relates to a photosensitive printing plate and a method of producing the same and, more particularly, to a photosensitive printing plate which is superior in vacuum contact properties and is free from tack on the surface when used, and is also superior in storage stability, and a method of producing the same.

This application is based on Japanese Patent Application No. 11-317405, the contents of which are incorporated herein by reference in their entirety.

2. Background Information

There has previously been employed a method of making a photosensitive printing plate and an original film which come closely into contact with each other under vacuum to make the original film and the surface of the photosensitive printing plate come closely into contact with each other, completely, when the photosensitive printing plate is exposed to light through the original film. In this method, since the smooth surface of the photosensitive printing plate prevents the space between the photosensitive printing plate and the original film from being evacuated, the time required to make the original film and the whole surface of the photosensitive printing plate come closely into contact with each other is lengthened, thereby drastically lowering efficiency of the plate making operation.

To reduce the time required for the original film and printing plate surface come closely into contact with each other while evacuating (hereinafter referred to as "vacuum close contact time"), Japanese Patent Application, First Publication No. 51-111102 has suggested a photosensitive printing plate produced by coating the surface of a photosensitive layer with a matting agent to form a fine pattern (mat particles) in which a coated portion and a non-coated portion are simultaneously present, while Japanese Patent Application, First Publication No. 55-12974 has suggested a photosensitive printing plate produced by thermally fusing solid powders to the surface of a photosensitive layer to form mat particles. However, materials of the mat particles in these photosensitive printing plates had drawbacks in that the mat particles are fractured by various pressures applied during the production, storage and use thereof because of poor mechanical strength, thereby lengthening the vacuum close contact time.

Japanese Patent Application, First Publication No. 57-34558 has suggested a photosensitive printing plate produced by spraying an aqueous solution, which is prepared by dissolving or dispersing a carboxyl group-containing water-soluble resin, over the surface of a photosensitive layer to form mat particles on the surface of the photosensitive layer. The mat particles of this photosensitive printing plate are superior in terms of adhesion to the photosensitive layer and have minimal peeling from the surface of the photosensitive layer by friction or pressure. In this photosensitive printing plate, a water-soluble resin is used as mat particles in view of the safety during the production thereof. However, since used water-soluble resin exhibits stickiness (tackiness) under the conditions of high temperature and high humidity, the mat particles on the photosensitive layer are adhered to the back surface of a substrate of the photosensitive printing plate, which is in contact with the mat particles, thereby making it impossible to transport using an automatic plate making machine, when pressure is applied on the surface of the photosensitive layer for a long period of time under conditions in which the photosensitive printing plates are stacked without interleaving paper between them.

Japanese Patent Application, First Publication No. 57-58152 has suggested, as a photosensitive printing plate having improved tack on the surface, a photosensitive printing plate produced by using a water-soluble resin containing an ammonium salt of acrylic acid unit as the resin for mat particles. However, when using such a resin, a photosensitive material in the photosensitive layer is decomposed after a lapse of time, thereby making it impossible to partially develop the photosensitive layer, resulting in poor storage stability.

Japanese Patent Application, First Publication No. 58-182636 has suggested a photosensitive printing plate produced by using a water-soluble resin having a sulfonic group as the resin for mat particles. However, when using such a resin, tack and storage stability under the conditions of high temperature and high humidity are improved but are still poor. That is, there were drawbacks in that a large content of the sulfonic group causes tack, while a large content of an alkali salt, an ammonium salt and a water-soluble amine salt causes poor storage stability.

SUMMARY OF THE INVENTION

An object of the present invention is to provide a photosensitive printing plate which has excellent vacuum contact properties and resistance to friction and pressure and is free from tack on the surface when used, and which causes no problem in developing properties during the storage for a long period of time.

The inventors have intensively studied to attain the above object and found that the above object can be attained by using, as mat particles, a copolymer containing (meth) acrylamides as a unit. Thus, the present invention has been achieved.

The photosensitive printing plate of the present invention comprises a substrate, a photosensitive layer formed on the substrate, and mat particles formed on the photosensitive layer, wherein the mat particles contain a copolymer which contains at least one (meth)acrylamides as a unit.

The method of producing the photosensitive printing plate of the present invention is a method of producing a photosensitive printing plate comprising a substrate, a photosensitive layer formed on the substrate, and mat particles formed on the photosensitive layer, the method comprising dissolving a copolymer containing at least one (meth) acrylamide as a unit in a solvent to prepare a solution, and coating the photosensitive layer with the solution to form mat particles.

The photosensitive printing plate of the present invention has excellent vacuum contact properties and resistance to friction and pressure and is free from tack on the surface when used, causes no problem in developing properties during storage for a long period of time, and is superior in terms of solubility in an exhausted developer. Regarding such a photosensitive printing plate, mat particles on the photosensitive layer are not adhered to the back surface of a substrate of the photosensitive printing plate, which is in contact with the mat particles, when a pressure is applied on the surface of the photosensitive layer for a long period of time in the state where the photosensitive printing plates are stacked without interleaving paper between them. Therefore the photosensitive printing plate of the present invention is preferably used in an automatic plate making machine.

According to the method of producing the photosensitive printing plate of the present invention, there can be produced a photosensitive printing plate which has excellent vacuum contact properties and resistance to friction and pressure and is free from tack on the surface when used, and also causes no problem in developing properties during the storage for a long period of time and is superior in solubility in an exhausted developer.

DETAILED DESCRIPTION OF THE INVENTION

Figure 1:
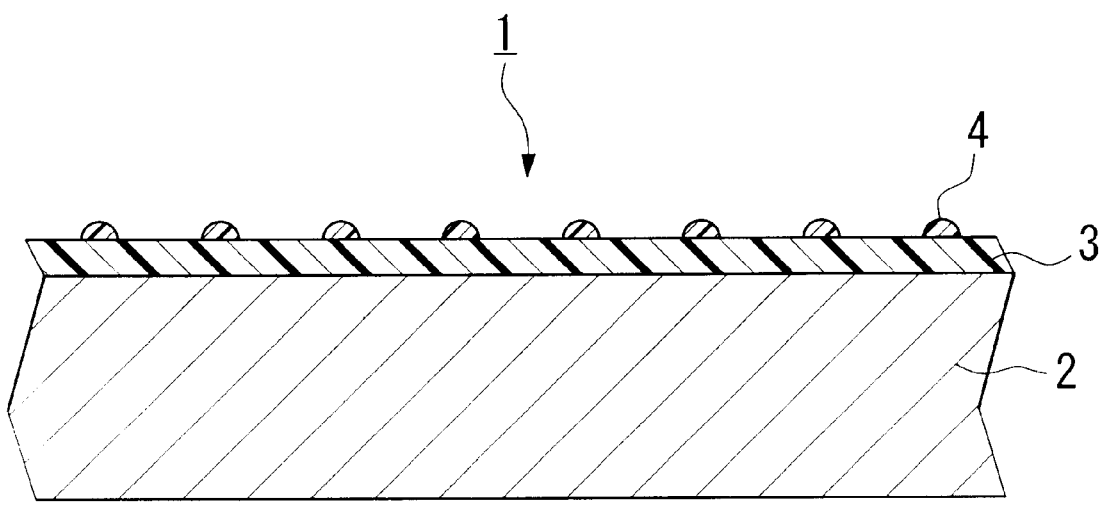
FIG. 1 is a schematic cross sectional view showing one embodiment of the photosensitive printing plate according to the present invention.

The photosensitive printing plate of the present invention is a photosensitive printing plate used in conjunction with a type of exposing to light in the state where an original film is layered on the photosensitive printing plate. Examples of such photosensitive printing plates include photosensitive metal relief printing plates, photosensitive resin relief printing plates, various photosensitive planographic printing plates, various photosensitive intaglio printing plates, photosensitive flexographic printing plates, photosensitive screen printing plates, various silver halide emulsion type printing plates and the like. The construction of the present invention will be described by way of the photosensitive planographic printing plate.

FIG. 1 is a schematic cross sectional view showing one embodiment of the photosensitive planographic printing plate according to the present invention. This photosensitive planographic printing plate 1 is schematically depicted as comprising a substrate 2, a photosensitive layer 3 formed on the substrate 2, and a plurality of mat particles 4 formed on the photosensitive layer 3.

The mat particles 4 contain a copolymer which contains at least one (meth)acrylamide as a constituent unit.

As used herein, the term "(meth)acrylamides" refers generically to methacrylamide and compounds derived therefrom as well as acrylamide and compounds derived therefrom, whereas, the term "(meth)acrylamide" refers generically to methacrylamide and acrylamide.

Specific examples of the (meth)acrylamides include (meth)acrylamide, N-methyl (meth)acrylamide, N-ethyl (meth)acrylamide, N-propyl (meth)acrylamide, N-butyl (meth)acrylamide, N-hexyl (meth)acrylamide, N-octyl (meth)acrylamide, N-cyclohexyl (meth)acrylamide, N-methylol (meth)acrylamide, N-hydroxyethyl (meth)acrylamide, N-benzyl (meth)acrylamide, N-phenyl (meth)acrylamide, N-nitrophenyl (meth)acrylamide, N-tolyl (meth)acrylamide, N-hydroxyphenyl (meth)acrylamide, N,N-dimethyl (meth)acrylamide, N,N-diethyl (meth)acrylamide, N,N-dicyclohexyl (meth)acrylamide and the like. These (meth)acrylamides may be used alone or in combination in the copolymer.

Among these (meth)acrylamides, for example, acrylamide, methacrylamide, N,N-dimethylacrylamide and N,N-dimethylmethacrylamide are preferable, and methacrylamide, N,N-dimethylacrylamide are more preferable. These (meth)acrylamides can be available at cheap price, and mat particles containing a copolymer which contains these (meth)acrylamides as a unit have comparatively low cost and good contact properties to the photosensitive layer, and also have high strength and less tack. Accordingly, a photosensitive planographic printing plate with such mat particles formed on the surface is particularly superior in vacuum contact properties and has less tack on the surface.

With respect to the copolymer for mat particles 4 in FIG. 1, the (meth)acrylamides provide the copolymer with enough strength to maintain good vacuum contact properties, and the (meth)acrylamides also provide the copolymer with solubility in a coating solvent and solubility in a developer. The copolymer containing the (meth) acrylamides as the constituent unit has good contact properties to the photosensitive layer 3 and less tack under the conditions of high temperature and high humidity. Furthermore, it does not decompose photosensitive material in the photosensitive layer 3 over time. A sufficient amount of the monomer of the (meth)acrylamides to achieve these effects is within a range of 20 to 90% by mole, and preferably within a range of 35 to 85% by mole, based on the total constituent components of the copolymer. When the amount of the (meth)acrylamides in the copolymer components is less than 20% by mole, sufficient solubility in the coating solvent and developer is not obtained. On the other hand, when the amount of the (meth)acrylamides exceeds 90% by mole, the copolymer exhibits tack sometimes during the storage under the conditions of high temperature and high humidity.

It is preferable that the copolymer for mat particles 4 does not have a sulfonic group. When the copolymer has a sulfonic group, the copolymer is likely to exhibit tack during storage under conditions of high temperature and high humidity. When the copolymer contains an alkali metal salt, an ammonium salt or a water-soluble amine salt of sulfonic acid, there is concern that the photosensitive layer 3 can not be developed partially during storage for a long time.

The copolymer for mat particles 4 can be produced by a known conventional method. For example, the copolymer can be produced by adding a conventional radical polymerization initiator to (meth)acrylamides and, if necessary, an addition-polymerizable unsaturated compound capable of copolymerizing with the (meth)acrylamides in an organic solvent, followed by thermal polymerization.

Examples of the addition-polymerizable unsaturated compound capable of copolymerizing with the (meth) acrylamides include (meth)acrylates such as methyl (meth) acrylate, ethyl (meth)acrylate, propyl (meth)acrylate, butyl (meth)acrylate, amyl (meth)acrylate, 2-ethylhexyl (meth) acrylate, octyl (meth)acrylate, 2-chloroethyl (meth)acrylate, cyclohexyl (meth)acrylate, 2-hydroxyethyl (meth)acrylate, 2-hydroxypropyl (meth)acrylate, 2-hydroxybutyl (meth) acrylate, diethylene glycol mono(meth)acrylate, 2-hydroxy-3-phenoxypropyl (meth)acrylate, glycidyl (meth)acrylate, diethylaminoethyl (meth)acrylate, furfuryl (meth)acrylate, tetrahydrofuryl (meth)acrylate, phenyl (meth)acrylate, hydroxyphenyl (meth)acrylate, cresyl (meth)acrylate, naphthyl (meth)acrylate, benzyl (meth)acrylate, methoxybenzyl (meth)acrylate, and the like; N-substituted maleimides such as N-methylmaleimide, N-ethylmaleimide, N-propylmaleimide, N-buthylmaleimide, N-pentylmaleimide, N-n-hexylmaleimide, N-laurylmaleimide, N-stearylmaleimide, N-cyclohexylmaleimide, N-phenylmaleimide, N-chlorophenylmaleimide, N-tolylmaleimide, N-hydroxymaleimide, N-benzylmaleimide, and the like; allyl compound such as allyl acetate, allyl caproate, allyl stearate, allyloxyethanol, and the like; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, diethylaminoethyl vinyl ether, and the like; vinyl esters such as vinyl acetate, vinyl butyrate, vinyl caproate, vinyl chloroacetate, vinyl methoxyacetate, vinyl phenylacetate, vinyl acetoacetate, vinyl benzoate, vinyl chlorobenzoate and the like; styrenes such as styrene, alpha-methylstyrene, methylstyrene, dimethylstyrene, chloromethylstyrene, ethoxymethylstyrene, hydroxystyrene, chlorostyrene, bromostyrene, and the like; vinyl ketones such as methyl vinyl ketone, ethyl vinyl ketone, propyl vinyl ketone, phenyl vinyl ketone, and the like; olefins such as isobutylene, butadiene, isoprene, and the like; butyl crotonate, dimethyl itaconate, diethyl itaconate, dimethyl maleate, diethyl fumarate, N-vinyl pyrrolidone, N-vinyl pyridine, and acrylonitrile.

Examples of the substrate 2 include a metal plate made of aluminum, zinc, copper, stainless steel, and iron; plastic film made of polyethylene terephthalate, polycarbonate, polyvinyl acetal, and polyethylene; paper coated with a molten synthetic resin or a synthetic resin solution; and composite made by forming a metal layer on a plastic film using a technique such as vacuum deposition or lamination, and materials used as the substrate of the printing plate.

The substrate having a surface made of metal, especially aluminum is preferably surface-treated by graining, anodizing, hydrophilization or the like.

The photosensitive layer 3 is a layer made of a photosensitive composition, and the photosensitive planographic printing plate 1 includes positive and negative working photosensitive planographic printing plates, which differ in formulation of the photosensitive composition used in the photosensitive layer 3.

The photosensitive composition for positive working photosensitive planographic printing plates may be any photosensitive composition as far as the solubility or swell characteristics in developer vary before and after exposure, and examples thereof include various known photosensitive materials such as positive working photosensitive compositions containing an alkali-soluble resin and an o-quinonediazide compound, three-component chemical amplification type positive working photosensitive compositions and the like. Among these photosensitive compositions, positive working photosensitive compositions containing an alkali-soluble resin and an o-quinonediazide compound can be used in the present invention, and are particularly preferred. The positive working photosensitive composition will be described below by way of this composition.

The o-quinonediazide compound is a compound having at least one o-quinonediazide group and is preferably a compound in which the solubility in aqueous alkali solution is enhanced by active light. Such compounds, having various structures, are known and described, for example, in "Light-Sensitive Systems" (John Wiley & Sons, Inc., published on 1965), pp. 336–352 (J. Kosar ed.).

As the positive working photosensitive material, sulfonates of various hydroxyl compounds and o-benzoquinonediazide or o-naphthoquinonediazide are preferable.

Examples of the o-quinonediazide compound include ester of 1,2-naphthoquinone-2-diazide-5-sulfonyl chloride and phenol-formaldehyde resin or cresol-formaldehyde resin; ester of 1,2-naphthoquinone-2-diazide-5-sulfonyl chloride and pyrogallol-acetone resin described in U.S. Pat. No. 3,635,709; ester of 1,2-naphthoquinone-2-diazide-5-sulfonyl chloride and resorcine-benzaldehyde resin described in Japanese Patent Application, Second Publication No. 63-13528; ester of 1,2-naphthoquinone-2-diazide-5-sulfonyl chloride and resorcine-pyrogallol-acetone co-condensation resin described in Japanese Patent Application, Second Publication No. 62-44257; compound obtained by esterifying a polyester having a hydroxyl group at terminal with 1,2-naphthoquinone-2-diazide-5-sulfonyl chloride described in Japanese Patent Application, Second Publication No. 56-45127; compound obtained by esterifying a homopolymer of N-(4-hydroxyphenyl) methacrylamide or a copolymer of other copolymerizable monomer with 1,2-naphthoquinone-2-diazide-5-sulfonyl chloride described in Japanese Patent Application, Second Publication No. 50-24641; ester of 1,2-naphthoquinone-2-diazide-5-sulfonyl chloride and bisphenol-formaldehyde resin described in Japanese Patent Application, Second Publication No. 54-29922; compound obtained by esterifying a homopolymer of p-hydroxystyrene or a copolymer of other copolymerizable monomer with 1,2-naphthoquinone-2-diazide-5-sulfonyl chloride described in Japanese Patent Application, Second Publication No. 52-36043; and ester of 1,2-naphthoquinone-2-diazide-5-sulfonyl chloride and polyhydroxybenzophenone.

Examples of known o-quinonediazide compound further include those described in Japanese Patent Application, First Publication No. 63-80254, Japanese Patent Application, First Publication No. 58-5737, Japanese Patent Application, First Publication No. 57-111530, Japanese Patent Application, First Publication No. 57-111531, Japanese Patent Application, First Publication No. 57-114138, Japanese Patent Application, First Publication No. 57-142635, Japanese Patent Application, First Publication No. 51-36129, Japanese Patent Application, Second Publication No. 62-3411, Japanese Patent Application, Second Publication No. 62-51459, and Japanese Patent Application, Second Publication No. 51-483.

The amount of the o-quinonediazide compound is usually within a range of 5 to 60% by weight, and preferably within a range of 10 to 40% by weight, based on the total solid content of the photosensitive composition.

In the positive working photosensitive composition, a resin which is insoluble in water and soluble in an aqueous alkali solution (hereinafter referred to as an "alkali-soluble resin") can be used as a binder resin, thereby making it possible to improve properties such as developing properties, durability, solvent resistance, and chemical resistance.

Examples of the alkali-soluble resin include novolak resins or resol resins, such as phenyl-formaldehyde resins, cresol-formaldehyde resins, and phenol-cresol-formaldehyde resins; acrylic resins containing one or more monomers having an acidic group, such as polyhydroxystyrene, polyhalogenated hydroxystyrene, N-(4-hydroxyphenyl)methacrylamide, hydroquinone monomethacrylate, N-(sulfamoylphenyl)methacrylamide, N-phenylsulfonylmethacrylamide, N-phenylsulfonylmaleimide, acrylic acid, and methacrylic acid; vinyl polymer resins such as active methylene group-containing resins described in Japanese Patent Application, First Publication No. 63-127237, and urea bond-containing resins described in Japanese Patent Application, First Publication No. 8-339082; polyurethane resins such as polyurethane resins having a N-sulfonylamide group, a N-sulfonylureido group and a N-aminosulfonylamide group described in Japanese Patent Application, First Publication No. 63-261350, and active imide group-containing polyurethane resins described in Japanese Patent Application, First Publication No. 2-77748; polyamide resins such as polyhydroxypolyamide described in Japanese Patent Application, First Publication No. 1-6947; and polyester resins such as polyester resins having a phenolic hydroxyl group described in Japanese Patent Application, First Publication No. 6-236029. These alkali-soluble resins may be used alone or in combination, and are usually used in the amount of 90% by weight or less based on the total weight of the composition.

If necessary, cyclic acid anhydrides for enhancing sensitivity, printing-out agents for forming a visible image immediately after exposure, dyes as an image colorant, and other fillers can be added in the positive working photosensitive composition.

Examples of cyclic acid anhydrides include succinic anhydride, glutaric anhydride, itaconic anhydride, phthalic anhydride, tetrahydrophthalic anhydride, hexahydrophthalic anhydride, maleic anhydride, chloromaleic anhydride, pyromellitic anhydride and the like. These cyclic acid anhydrides can be contained in the amount within a range of 1 to 15% by weight based on the total composition.

Examples of print-out agents for forming a visible image immediately after exposure include combination of a photosensitive compound capable of producing an acid by exposure and an organic dye capable of forming a salt with the acid thereby changing color tone.

Examples of the photosensitive compound capable of producing an acid by exposure include o-naphthoquinonediazide-4-halogenide sulfonate described in Japanese Patent Application, First Publication No. 50-36209; trihalomethyl-2-pyrone or trihalomethyl-s-triazine described in Japanese Patent Application, First Publication No. 53-36223; various o-naphthoquinonediazide compounds described in Japanese Patent Application, First Publication No. 55-62444; 2-trihalomethyl-5-aryl-1,3,4-oxadiazole compound described in Japanese Patent Application, First Publication No. 55-77742; and diazonium salt. These compounds can be used alone or in combination and the amount is preferably within a range of 0.3 to 15% by weight based on the total weight of the composition.

Examples of the organic dye capable of forming a salt include triphenylmethane dye, cyanine dye, diazo dye, styryl dye and the like. Specific examples thereof include Crystal Violet, Ethyl Violet, Methyl Violet, Methylene Blue, Victoria Blue BH, Victoria Pure Blue BOH, Malachite Green, Oil Blue #603, Oil Green BG, Brilliant Green, Fuchsine, Eosin, Rhodamine B, Oil Pink #312, Oil Red 5B, Oil Black BS, Oil Yellow #101, Phenolphthalein, Cresol Red, Auramine, Leucocrystal Violet, Leucomalachite Green and the like. The amount is preferably within a range of 0.3 to 15% by weight based on the total weight of the composition.

In the positive working photosensitive composition, it is possible to add various additives, for example, various resins having a hydrophobic group for improving ink acceptability of image, such as octylphenolformaldehyde resin, t-butylphenolformaldehyde resin, t-butylphenolbenzaldehyde resin, rosin-modified novolak resin, and o-naphthoquinonediazide sulfonate of the modified novolak resin; and plasticizers for improving flexibility of coated film, such as dibutyl phthalate, dioctyl phthalate, butyl glycolate, tricresyl phosphate, and dioctyl adipate for various purposes. The amount is preferably within a range of 0.01 to 30% by weight based on the total weight of the composition.

Examples of the photosensitive material used as the photosensitive composition for producing a negative working photosensitive printing plate include systems which can be preferably used, such as: (1) photosensitive diazonium compounds; (2) combinations of addition-polymerizable unsaturated group-containing compounds and photopolymerization initiators; and (3) combinations of photosensitive diazonium compounds, addition-polymerizable unsaturated group-containing compounds and photopolymerization initiators.

Examples of the photosensitive diazonium compounds (1) above include diazo resins such as salts of condensates of diazodiarylamine and active carbonyl compounds, preferably compounds which are photosensitive and also insoluble in water and soluble in an organic solvent.

Examples of particularly preferable diazo resins include organic acid or inorganic acid salts of condensates of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine or 4-diazo-3-methoxyldiphenylamine, and formaldehyde, paraformaldehyde, acetaldehyde, benzaldehyde or 4,4'-bis-methoxymethyl diphenyl ether.

Examples of organic acids of the diazo resins include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid and the like. Examples of inorganic acids include hexafluorophosphoric acid, tetrafluoroboric acid, thiocyanic acid and the like.

There can also be used diazo resins having a polyester group at a principal chain as described in Japanese Patent Application, First Publication No. 54-30121; diazo resins obtained by reacting a polymer having a carboxylic anhydride group with a diazo compound having a hydroxyl group as described in Japanese Patent Application, First Publication No. 61-273538; and diazo resins obtained by reacting a polyisocyanate compound with a diazo compound having a hydroxyl group.

The amount of the diazo resin is preferably within a range of 0 to 40% by weight based on the solid content of the composition and, if necessary, two or more diazo compounds may be used in combination.

In case the negative working photosensitive composition is prepared, an organic polymeric binder is usually used in combination. Examples of the organic polymeric binders include acrylic resins, polyamide resins, polyester resins, epoxy resins, polyacetal resins, polystyrene resins, novolak resins and the like.

To improve performance, for example, known additives such as thermal polymerization inhibitors, dyes, pigments, plasticizers, and stability improvers can also be added.

Examples of preferable dyes include basic oil-soluble dyes such as Crystal Violet, Malachite Green, Victoria Blue, Methylene Blue, Ethyl Violet, Rhodamine B and the like. Commercially available products include, for example, "Victoria Blue BOH" (manufactured by Hodogaya Chemical Industries Co., Ltd.), "Oil Blue #603" (manufactured by Orient Chemical Industries Co., Ltd.) and the like. Examples of the pigment include Phthalocyanine Blue, Phthalocyanine Green, Dioxadine Violet, Quinacridone Red and the like.

Examples of plasticizers include diethyl phthalate, dibutyl phthalate, dioctyl phthalate, tributyl phosphate, trioctyl phosphate, tricresyl phosphate, tri(2-chloroethyl) phosphate, tributyl citrate and the like.

Furthermore, phosphoric acid, phosphorous acid, oxalic acid, tartaric acid, malic acid, citric acid, dipicolinic acid, polyacrylic acid, benzenesulfonic acid and toluenesulfonic acid can also be used in combination as the known stability improver.

The amount of various additives which may be used varies depending on the purpose, but is preferably within a range of 0 to 30% by weight based on the solid content of the photosensitive composition.

The photosensitive composition (2) above containing an addition-polymerizable unsaturated group-containing compound and a photopolymerization initiator includes, for example, compositions comprising an addition-polymerizable unsaturated group-containing compound having two or more terminal ethylene groups and a photo-polymerization initiator, which are described in U.S. Pat. Nos. 2,760,863 and 3,060,023 and Japanese Patent Application, First Publication No. 62-121448.

The term "addition-polymerizable unsaturated group-containing compound" refers to a monomer or oligomer which has a boiling point of 100° C. or higher at normal pressure and has at least one, preferably two or more addition-polymerizable ethylenic unsaturated groups, in a molecule. Examples of the monomer or oligomer include monofunctional (meth)acrylates such as polyethylene glycol mono(meth)acrylate (methacerylate and acrylate are generically referred to herein as (meth)acrylate), polypropylene glycol mono(meth)acrylate, and phenoxyethyl (meth) acrylate; and polyfunctional (meth)acrylates such as polyethylene glycol di(meth)acrylate, polypropylene glycol di(meth)acrylate, trimethylolropane tri(meth)acrylate, neopentyl glycol di(meth)acrylate, pentaerythritol tri(meth) acrylate, pentaerythritol tetra(meth)acrylate, dipentaerythritol hexa(meth)acrylate, hexanediol di(meth)acrylate, tri (acryloyloxyethyl) isocyanurate, (meth)acrylate of polyhydric alcohol-alkylene oxide adduct, (meth)acrylate of polyhydric phenol-alkylene oxide adduct, urethane acrylates described in Japanese Patent Application, Second Publication No. 48-41708, Japanese Patent Application, Second Publication No. 50-6034 and Japanese Patent Application, Second Publication No. 51-37193, polyester acrylates described in Japanese Patent Application, First Publication No. 48-64183, Japanese Patent Application, Second Publication No. 49-43191 and Japanese Patent Application, Second Publication No. Sho 52-30490, and epoxy acrylates obtained by addition reaction between epoxy resin and (meth)acrylic acid.

The amount of these compounds having an addition-polymerizable ethylenically unsaturated group is preferably within a range of 5 to 70% by weight based on the solid content of the composition.

Examples of the photopolymerization initiator include alpha-carbonyl compounds described in U.S. Pat. No. 2,367, 661, acyloin ethers described in U.S. Pat. No. 2,448,828, alpha-hydrocarbon-substituted aromatic acyloin compounds described in U.S. Pat. No. 2,722,512, polynuclear quinone compounds described in U.S. Pat. No. 3,046,127, combinations of triaryl biimidazole and p-aminophenylketone described in U.S. Pat. No. 3,549,367, trihalomethyl-s-triazine compounds described in U.S. Pat. No. 4,239,850, oxadiazole compounds described in U.S. Pat. No. 4,212,970, acridine and phenazine compounds described in U.S. Pat. No. 3,751,259, benzothiazole compounds described in Japanese Patent Application, Second Publication No. 51-48516 and the like. The amount of the photopolymerization initiator is preferably within a range of 0.5 to 20% by weight based on the solid content of the composition.

The negative working photosensitive material described above is characterized in that: (1) when using a photosensitive diazonium compound, good adhesion is achieved between the photosensitive layer and substrate; (2) when using a combination of the addition-polymerizable unsaturated group-containing compound and photopolymerization initiator, a tough coated film can be obtained by exposure; and (3) when using a combination of the photosensitive diazonium compound, addition-polymerizable unsaturated group-containing compound and photopolymerization initiator, a coated film having features of both can be obtained.

In the negative working photosensitive composition, there can be used binder resins, for example, copolymers such as (meth)acrylic acid-(meth)acrylate copolymers, copolymers containing hydroxyalkyl (meth)acrylate and (meth) acrylonitrile having acid value of 10 to 100 described in U.S. Pat. No. 4,123,276, copolymer having aromatic hydroxyl groups as described in Japanese Patent Application, Second Publication No. 57-43890, and polymers having 2-hydroxy-3-phenoxypropyl (meth)acrylate units as described in Japanese Patent Application, Second Publication No. 57-51656; epoxy resins; polyamide resins; halogenated vinyls, especially polyvinyl chloride and polyvinylidene chloride; polyvinyl acetates; polyesters; acetal resins such as formal resin and butyral resin; soluble polyurethane resins marketed by B. F. Goodrich under the commercial name ESTANE; polystyrenes; styrene-maleic anhydride copolymers or half-esters thereof; cellulose derivatives; shellacs; rosins or derivatives thereof; and copolymers having an unsaturated group at a side chain as described in Japanese Patent Application, First Publication No. 61-285449.

In case of the photosensitive composition containing a photo-crosslinkable resin, a photo-crosslinkable resin having affinity with an aqueous alkali developer is preferable as the photo-crosslinkable resin. There can be used, for example, copolymers having a cinnamic group and a carboxyl group as described in Japanese Patent Application, Second Publication No. 54-15711; polyester resins having a phenylenediacrylic acid residue and a carboxyl group as described in Japanese Patent Application, First Publication No. 60-165646; polyester resins having a phenylenediacrylic acid residue and a phenolic hydroxyl group as described in Japanese Patent Application, First Publication No. 60-203630; polyester resins having a phenylenediacrylic residue and a sodium iminodisulfonyl group as described in Japanese Patent Application, Second Publication No. 57-42858; and polymers having an azide group and a carboxyl group at a side chain as described in Japanese Patent Application, First Publication No. 59-208552.

The above negative working photosensitive composition is dissolved in a proper solvent after dyes, pigments, stabilizers, fillers and crosslinking agents are added, if necessary.

The method of producing the photosensitive printing plate of the present invention will be described referring to the photosensitive planographic printing plate 1 in FIG. 1.

First, the surface of the substrate 2 is coated with a solution prepared by dissolving or dispersing the above photosensitive composition in an organic solvent, and then the solution is dried to form the photosensitive layer 3 on the substrate 2. A copolymer containing (meth)acrylamides as a constituent unit is dissolved in a coating solvent to provide a solution, and the photosensitive layer 3 is coated with the solution to form mat particles 4.

As the organic solvent in which the photosensitive composition is dissolved or dispersed, for example, any conventionally known organic solvents can be used. In particular, an organic solvent having a boiling point within a range of 40 to 200° C., especially within a range of 60 to 160° C., is selected in view of the advantage on drying.

Examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexane, and acetylacetone; hydrocarbons such as hexane, cyclohexane, heptane, octane, nonane, decane, benzene, toluene, xylene, and methoxybenzene; acetates such as ethyl acetate, n- or iso-propyl acetate, n- or iso-butyl acetate, ethylbutyl acetate, and hexyl acetate; halides such as methylene dichloride, ethylene dichloride, and monochlorobenzene; ethers such as isopropyl ether, n-butyl ether, dioxane, dimethyl dioxane, and tetrahydrofuran; polyhydric alcohols and derivatives thereof, such as ethylene glycol, methylcellosolve, methylcellosolve acetate, ethylcellosolve, diethylcellosolve, cellosolve acetate, butylcellosolve, butylcellosolve acetate, methoxymethoxy ethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, and 3-mehyl-3-methoxybutanol; and special solvents such as dimethyl sulfoxide, N,N-dimethylformamide, methyl acetate, and ethyl lactate. These organic solvents are used alone or in combination. The concentration of the solid in the photosensitive composition used for coating is suitably controlled within a range of 2 to 50% by weight.

As the method of coating with the photosensitive composition, for example, there can be used methods such as roll coating, dip coating, air knife coating, gravure coating, gravure offset coating, hopper coating, blade coating, wire doctor coating, spray coating and the like. The coating weight of the photosensitive composition is preferably within a range of 10 to 100 ml/m$^2$.

The coated substrate 2 is usually dried by using heated air. The heating is performed at a temperature within a range of 30 to 200° C., and particularly within a range of 40 to 140° C. Not only the method of maintaining the drying temperature at a fixed temperature during the drying, but also the method of increasing the drying temperature can be carried out in stages.

Preferable results can be obtained on occasion by dehumidification of dry air. The heated air is fed to the coated surface at a rate within a range of 0.1 to 30 m/second, and particularly within a range of 0.5 to 20 m/second.

The coating weight of the photosensitive composition is usually within the range of about 0.5 to 5 g/m$^2$ on a dry weight basis.

As the coating solvent in which the copolymer containing (meth)acrylamides as a unit is dissolved or dispersed, for example, water and various organic solvents are used alone or in combination. Specific examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone; hydrocarbons such as hexane, cyclohexane, heptane, octane, nonane, decane, benzene, toluene, xylene, and methoxybenzene; acetates such as ethyl acetate, n -or iso-propyl acetate, n- or iso-butyl acetate, ethylbutyl acetate, and hexyl acetate; halides such as methylene dichloride, ethylene dichloride, and monochlorobenzene; ethers such as isopropyl ether, n-butyl ether, dioxane, dimethyl dioxane, and tetrahydrofuran; polyhydric alcohols and derivatives thereof, such as ethylene glycol, methylcellosolve, methylcellosolve acetate, ethylcellosolve, diethylcellosolve, cellosolve acetate, butylcellosolve, butylcellosolve acetate, methoxymethoxy ethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, and 3-mehyl-3-methoxybutanol; and special solvents such as dimethyl sulfoxide, N,N-dimethylformamide, methyl acetate, and ethyl lactate. Among these coating solvents, water is preferably used alone or in combination with other organic solvents for safety reasons.

Various additives can be added to the above solution. Examples of these additives include light absorbents having optical absorption within an active light range of the photosensitive layer 3 of the photosensitive planographic printing plate 1, dyes, pigments, ultraviolet absorbers, fluorine surfactants, silicone surfactants, diazo compounds, ethylenic unsaturated compounds, and fillers such as silicon dioxide, titanium oxide, zirconium oxide, glass particles, alumina and polymer particles.

As the method of coating the photosensitive layer 3 with a solution prepared by dissolving or dispersing a copolymer containing (meth)acrylamides as a unit, for example, there can be used known methods such as air spray methods, airless spray methods, electrostatic air spray methods, electrostatic coating methods by electrostatic atomizing and the like. The number of mat particles formed by these methods is within a range of 1 to 1000/mm$^2$, and preferably within a range of 5 to 500/mm$^2$. The height is preferably within a range of about 0.5 to 20 μm and the diameter is within a range of about 1 to 200 μm.

EXAMPLES

The following examples further illustrate the present invention in detail, but the present invention is not limited by these examples. In the examples, percentages are by weight unless otherwise stated.

An aluminum plate having a thickness of 0.30 mm was degreased by using an aqueous sodium hydroxide solution and then electrochemically grained in a 2% hydrochloric acid bath to obtain a grained plate of 0.6 μm in center line average roughness (Ra). The resulting grained plate was anodized in a 20% sulfuric acid bath at a current density of 2 A/dm$^2$ to form 2.7 g/m$^2$ of an oxide layer and, furthermore, the plate was passed through an aqueous 2.5% sodium silicate solution at 70° C. for 30 seconds, washed with water and then dried to obtain a substrate.

The substrate was coated with a coating solution of the formulation shown in Table 1 at low speed using a roll coater, and then dried at 100° C. for three minutes to form a photosensitive layer. The dry coating weight was 2.0 g/m$^2$.

TABLE 1

| Coating solution of photosensitive composition | Unit: g |
|---|---|
| 2-hydroxyethyl methacrylate copolymer (described in Example 1 of Japanese Patent Application, First Publication No. 50-118802) | 1.75 |
| 2-methoxy-4-hydroxy-5-benzoylbenzenesulfonate salt of condensate of p-diazodiphenylamine and formaldehyde | 0.20 |
| Oil Blue #603 (manufactured by Orient Chemical Industries Co., Ltd.) | 0.05 |
| Methyl glycol | 28.0 |
| Methylcellosolve acetate | 20.0 |

The 2-hydroxyetyl methacrylate copolymer in Table 1 was prepared in the following manner.

Under a nitrogen flow, 300 g of dioxane was heated to 100° C. and a mixed solution of 150 g of 2-hydroxyethyl methacrylate, 60 g of acrylonitrile, 79.5 g of methyl methacrylate, 10.5 g of methacrylic acid and 1.2 g of benzoyl peroxide was added dropwise over two hours. After 15 minutes passed since the completion of the dropwise addition, 300 g of dioxane and 0.3 g of benzoyl peroxide were added and the reaction was performed for four hours. After the completion of the reaction, the reaction solution was diluted with methanol and poured into water, thereby precipitating a copolymer. The precipitate was vacuum-dried at 70° C. to obtain a 2-hydroxyetyl methacrylate copolymer described in Japanese Patent Application, First Publication No. 50-118802. The acid value was 20.

Examples 1 to 7 and Comparative Examples 1 to 3

A copolymer of the formulation shown in Table 2 was dissolved in a mixed solvent of water and ethanol (weight ratio of water to ethanol=60:40) and the surface of a photosensitive layer was coated with the resulting solution (solid content: 20%) by an electrostatic coating method, and then dried in an atmosphere at a temperature of 90° C. for five seconds to form mat particles on the surface of the photosensitive layer. The coating weight of the copolymer was about 0.1 g/m$^2$ and the number of the mat particles was within a range of 50 to 200/mm$^2$ and, furthermore, the height thereof was within a range of 5 to 20 μm and the diameter was within a range of 20 to 100 μm. The vacuum contact time was evaluated by using an exposure device manufactured by Dainippon Screen MFG. Co., Ltd., Inc. under conditions in which a film of 550 mm×650 mm in size was placed on the resulting photosensitive printing plate of 1030 mm×800 mm in size. As a result, all samples showed the vacuum close contact time within a range of 10 to 15 seconds.

TABLE 2

| | (Meth) acrylamides component (% by mole) | | Other components (% by mole) | | | |
|---|---|---|---|---|---|---|
| | Methacrylamide | N,N-dimethylacrylamide | Methyl methacrylate | Ethyl methacrylate | Acrylic acid | Acrylic acid sodium salt |
| Examples | | | | | | |
| 1 | 23 | 60 | | 17 | | |
| 2 | | 40 | 30 | 30 | | |
| 3 | 20 | | 50 | 30 | | |
| 4 | 11 | 76 | | | 13 | |
| 5 | 20 | | | 30 | 50 | |
| 6 | | 35 | | 15 | 50 | |
| 7 | | 45 | | 15 | 40 | |
| Comp. Examples | | | | | | |
| 1 | | | 50 | 30 | 20 | |
| 2 | | | 50 | 30 | | 20 |
| 3 | | | 80 | 8 | | 12 |

With respect to the respective photosensitive printing plates thus obtained, the following items were evaluated and performances of the mat particles were confirmed. The results are shown in Table 3. The evaluation results of the respective items were judged by ranks A to E (with A representing the best results and E representing the worst results).

HT Developing Properties

The respective photosensitive printing plates were allowed to stand under the conditions of a temperature of 60° C. and a humidity of 75% for 24 hours and developed at 30° C. for 20 seconds by an automatic processor PD-912 manufactured by Dainippon Screen MFG. Co., Ltd., Incorporation, using a developer prepared by diluting a developer ND-1 manufactured by Kodak Polychrome Graphics Japan Ltd. with water in a volume ratio of 1:3

(ND-1: water), and then the developing properties of the trace of the mat particles were confirmed.

Tack

Five photosensitive printing plates were stacked without interleaving paper between them and allowed to stand under the conditions of a temperature of 40° C. and a humidity of 80% for five hours while applying a pressure of 0.2 kg/cm$^2$, and then the state of contact between the plates was confirmed.

Developing Properties for Exhausted Developer

A developer in the state of being exhausted was prepared by treating a negative working photosensitive planographic printing plate NN-2 manufactured by Kodak Polychrome Graphics Japan Ltd. with a developer in a volume ratio of 1:3 (ND-1: water) Using this exhausted developer, the respective photosensitive printing plates were developed, and then the developing properties of the trace of the mat particles were confirmed.

TABLE 3

| | | Evaluation results | | |
|---|---|---|---|---|
| | | HT developing properties | Tack | Developing properties for exhausted developer |
| Examples | 1 | A | A | A |
| | 2 | A | A | A |
| | 3 | A | A | A |
| | 4 | A | A–B | A–B |
| | 5 | A–B | A | A–B |
| | 6 | A–B | A | A |
| | 7 | A–B | A | A |
| Comp. Examples | 1 | B | A | E |
| | 2 | E | A | A–B |
| | 3 | E | A | A–B |

As shown in Table 3, the use of a copolymer containing (meth)acrylamides as a unit afforded a photosensitive printing plate which is superior in stability during the storage and is free from tack, and which has excellent developing properties using exhausted developer.

What is claimed is:

1. A photosensitive printing plate comprising a substrate, a photosensitive layer formed on said substrate, and mat particles formed on said photosensitive layer, wherein said mat particles contain a copolymer which comprises a (meth) acrylamide unit and an addition-polymerizable unsaturated compound unit capable of copolymerizing with the (meth) acrylamide, and said copolymer does not comprise a carboxylic acid unit and does not comprise a phenolic hydroxyl group.

2. The photosensitive printing plate according to claim 1, wherein said (meth)acrylamides comprise at least one selected from the group consisting of acrylamide, methacrylamide, N,N-dimethylacrylamide and N,N-dimethylmethacrylamide.

3. The photosensitive printing plate according to claim 1, wherein the amount of said (meth)acrylamides is within a range of 20 to 90% by mole, based on the total constituent components of the copolymer.

4. The photosensitive printing plate according to claim 1, wherein the amount of said (meth)acrylamides is within a range of 35 to 85% by mole, based on the total constituent components of the copolymer.

5. The photosensitive printing plate according to claim 1, wherein said copolymer does not have a sulfonic acid group.

6. The photosensitive printing plate according to claim 1, wherein said photosensitive layer is a layer made of a positive working photosensitive composition.

7. The photosensitive printing plate according to claim 1, wherein said photosensitive layer is a layer made of a negative working photosensitive composition.

8. The photosensitive printing plate according to claim 6, wherein said positive working photosensitive composition comprises an alkali-soluble resin and an o-quinonediazide compound.

9. The photosensitive printing plate according to claim 7, wherein said negative working photosensitive composition comprises a photosensitive diazonium compound.

10. The photosensitive printing plate according to claim 7, wherein said negative working photosensitive composition comprises an addition-polymerizable unsaturated group-containing compound and a photopolymerization initiator.

11. The photosensitive printing plate according to claim 7, wherein said negative working photosensitive composition comprises a photosensitive diazonium compound, an addition-polymerizable unsaturated group-containing compound and a photopolymerization initiator.

12. The photosensitive printing plate according to claim 1, wherein the number of said mat particles is within a range of 1 to 1000/mm$^2$.

13. The photosensitive printing plate according to claim 1, wherein the number of said mat particles is within a range of 5 to 500/mm$^2$.

14. The photosensitive printing plate according to claim 1, wherein the height of said mat particles is within a range of 0.5 to 20 μm.

15. A method of producing a photosensitive printing plate, which comprises the steps of:

forming a photosensitive layer on a substrate, and coating said photosensitive layer with a solution prepared by dissolving a copolymer comprising a (meth) acrylamide unit and an addition-polymerizable unsaturated compound unit capable of copolymerizing with the (meth)acrylamide in a solvent to form mat particles, wherein said copolymer does not comprise a carboxylic acid unit and docs not comprise a phenolic hydroxyl group.

16. The method of producing a photosensitive printing plate according to claim 15, wherein said solvent is a solvent containing water.

17. The method of producing a photosensitive printing plate according to claim 15, wherein said step of coating is performed by a electrostatic coating method.

18. The photosensitive printing plate according to claim 1, wherein the addition-polymerizable unsaturated compound unit comprises at least one compound selected from the group consisting of (meth)acrylates, N-substituted maleimides, allyl compounds, vinyl ethers, vinyl esters, styrenes, vinyl ketones and olefins.

19. The photosensitive printing plate according to claim 1, wherein the mat particles are formed by spray coating a solution of the copolymer on the photosensitive layer.

* * * * *